(12) United States Patent
Kuo et al.

(10) Patent No.: US 8,730,724 B2
(45) Date of Patent: May 20, 2014

(54) COMMON LINE CURRENT FOR PROGRAM LEVEL DETERMINATION IN FLASH MEMORY

(75) Inventors: Tien-Chien Kuo, Sunnyvale, CA (US); Jonathan H. Huynh, San Jose, CA (US); Sung-En Wang, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 102 days.

(21) Appl. No.: 13/569,024

(22) Filed: Aug. 7, 2012

(65) Prior Publication Data

US 2014/0043898 A1 Feb. 13, 2014

(51) Int. Cl.
*G11C 16/04* (2006.01)
*G11C 11/56* (2006.01)

(52) U.S. Cl.
CPC .................................. *G11C 11/5628* (2013.01)
USPC ............ 365/185.03; 365/185.09; 365/185.22; 365/185.17; 365/185.21

(58) Field of Classification Search
CPC ........... G11C 11/5628; G11C 11/5642; G11C 11/5621
USPC ............. 365/185.03, 185.09, 185.22, 185.17, 365/185.21
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,941,412 B2 | 9/2005 | Gongwer et al. | |
| 7,057,939 B2 | 6/2006 | Li et al. | |
| 7,369,441 B2 | 5/2008 | Huang | |
| 7,719,891 B2 * | 5/2010 | Lim | 365/185.09 |
| 7,773,419 B2 * | 8/2010 | Nam et al. | 365/185.03 |
| 8,127,200 B2 | 2/2012 | Sharon et al. | |
| 2001/0040824 A1 | 11/2001 | Banks | |
| 2002/0021581 A1 | 2/2002 | Lin | |
| 2008/0144380 A1 | 6/2008 | Youn et al. | |
| 2008/0155364 A1 | 6/2008 | Hwang | |
| 2008/0316824 A1 | 12/2008 | Park et al. | |
| 2012/0033491 A1 * | 2/2012 | Shelton et al. | 365/185.2 |
| 2013/0124784 A1 | 5/2013 | Woo et al. | |
| 2013/0201761 A1 * | 8/2013 | Kim et al. | 365/185.17 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Connie Yoha
(74) *Attorney, Agent, or Firm* — Davis Wright Tremaine LLP (57) ABSTRACT

In a nonvolatile memory array that stores randomized data, the program level—the number of states per cell stored in a population of memory cells—is determined from the total current passing through the population of memory cells under read conditions, as observed on a common line, for example a source line in NAND flash memory.

17 Claims, 10 Drawing Sheets

(56) References Cited

OTHER PUBLICATIONS

Notification of Transmittal of the International Search Report and the Written Opinion of the International Searching Authority, or the Declaration for International Appl. No. PCT/US2013/051359 mailed Nov. 6, 2013, 10 pages.

Notification of Transmittal of the International Search Report and the Written Opinion of the International Searching Authority, or the Declaration for International Appl. No. PCT/US2013/051364 mailed Nov. 13, 2013, 10 pages.

Office Action for U.S. Appl. No. 13/569,008 mailed Feb. 13, 2014, 17 pages.

* cited by examiner

Programming into four states represented by a 2-bit code

FIG. 6

Multistate Memory

FIG. 7A

Lower Page Programming (2-bit Code)

FIG. 7B

Upper Page Programming (2-bit Code)

FIG. 7C

Lower Page Read (2-bit Code)

FIG. 7D

Upper Page Read (2-bit Code)

COMMON LINE CURRENT FOR PROGRAM LEVEL DETERMINATION IN FLASH MEMORY

BACKGROUND

This application relates to the operation of re-programmable non-volatile memory systems such as semiconductor flash memory that can store one or more bits per cell by writing multiple states, and more specifically, to determination of the number of states per cell written in a page of such a memory.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

In one common arrangement, individual cells may use two or more memory states to store one or more bits of data. Initially, a page of memory cells may be programmed with a "lower page" of data consisting of one bit per cell. Later programming may add an "upper page" of data in the same cells by writing an additional bit in each cell. More than two bits may also be successively stored in this way in some memory systems. At any given time, a memory may include physical pages with different program levels, some physical pages containing zero bits per cell, some with one bit per cell, and some with two or more bits per cell. When programming such memories it is important to know how many bits per cell a particular page contains.

One way to know how many bits are stored in a particular page is to use a separate flag or indicator associated with the page. While a flag or other indicator may be provided to indicate the number of bits per page, this requires valuable space, adds to cost and complexity, may require additional read and write steps, and may not be reliable. Therefore, there is a general need for systems and methods for reliably and efficiently determining the number of bits stored per cell in a flash memory.

SUMMARY OF THE INVENTION

In some examples, the programming level of a group of memory cells (e.g. a page of memory cells) can be determined from the cells rather than using any flag or other external indicator. The combined cell current for a group of cells that are connected to a common line may be used as an indicator of programming level. A current mirror may be used to generate a mirror current that is a small fraction of the combined current, and this mirror current may be compared with one or more predetermined currents that correspond to different program levels.

According to an example, a method of determining how many states are written per cell in a page of flash memory includes: generating a representative current from bit line currents of a plurality of bit lines connected to flash memory cells of the page; and comparing the representative current with a predetermined reference current to obtain an indication of how many states are written per page.

The representative current may be generated from a regulator connected to the plurality of bit lines during a read operation, the representative current being proportional to the total current through the plurality of bit lines during a read operation. The flash memory may be a NAND flash memory and the regulator may control the voltage level of the source line that connects to the source side of a plurality of NAND strings containing the page of flash memory cells. The bit line currents may be generated under read conditions corresponding to a flash memory cell threshold voltage that is below the threshold voltage of a flash memory cell programmed with more than one bit per cell. The representative current may be generated through a current mirror which generates a mirror current that is proportional to the bit line currents of the plurality of bit lines connected to flash memory cells of the page. The mirror current may be approximately $\frac{1}{1000}$ of the current in the plurality of bit lines.

An example of a multi-level cell flash memory includes: a plurality of flash memory cells forming a page; a common source line connected to the plurality of flash memory cells forming the page so as to sink current flowing through all of the plurality of flash memory cells; a current mirror configured to provide a mirror current that is proportional to the current in the common source line; and a current comparison circuit that compares the mirror current with a predetermined reference current.

The flash memory may be a NAND flash memory and the common source line may be connected to the source side of a plurality of NAND strings that contain the plurality of flash memory cells forming the page. The common source line may be connected to a first transistor that is controlled by a regulator to maintain source line voltage, and the regulator may control a second transistor in the current mirror that is smaller than the first transistor to provide a mirror current that is smaller than the current in the common source line. The flash memory may include a reference current generator that generates the predetermined reference current. The flash memory may include a reference current storage unit that maintains a value reflecting the predetermined reference current in non-volatile storage and provides the value to the reference current generator. The flash memory may include a voltage comparator comparing a predetermined reference voltage with a voltage at a node between the reference current generator and the current mirror.

An example of a method of identifying a degree of programming of a page of flash memory includes: providing a current to a plurality of memory cells that form the page of flash memory through a common line while the plurality of memory cells are subjected to read conditions; mirroring the current through the common line to generate a mirror current that is proportional to the current in the common line; and comparing the mirror current with a predetermined reference current to determine if the current through the plurality of cells reflects programming beyond a predetermined degree.

The predetermined reference current may be obtained from mirror current values observed with known degrees of programming. Obtaining the predetermined reference current may be performed as part of a product configuration routine. Subsequent to the comparing, data may be written in the plurality of cells only if the comparing reflects that the plurality of cells are not programmed beyond the predetermined degree. The plurality of memory cells may be configured to have four memory states and the predetermined degree may correspond to cells programmed to only two lower memory states.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6(0)-6(2) illustrate an example of programming a population of 4-state memory cells.

DETAILED DESCRIPTION

Memory System

Figure 1:
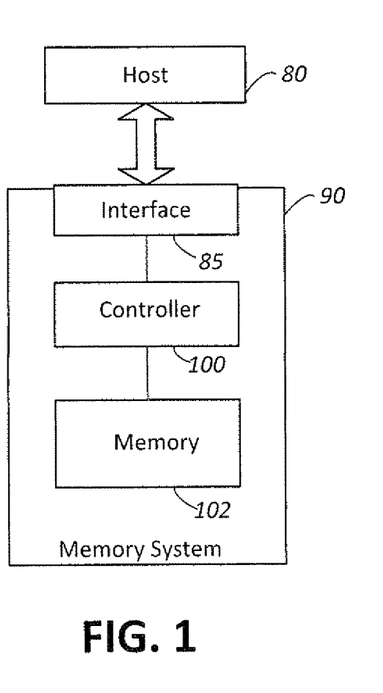
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
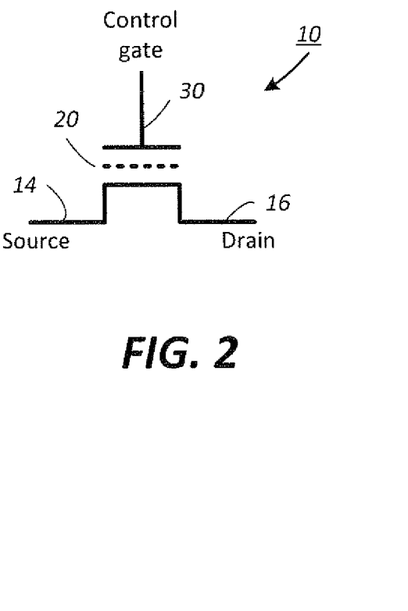
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
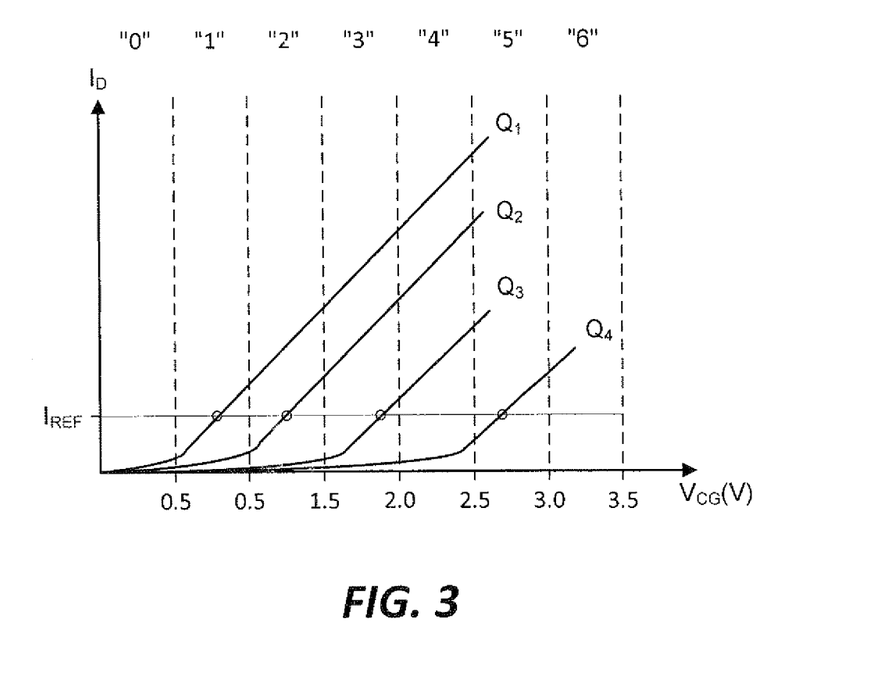
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges QI-Q4 that the floating gate may be selectively storing at any one time. With fixed drain voltage bias. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
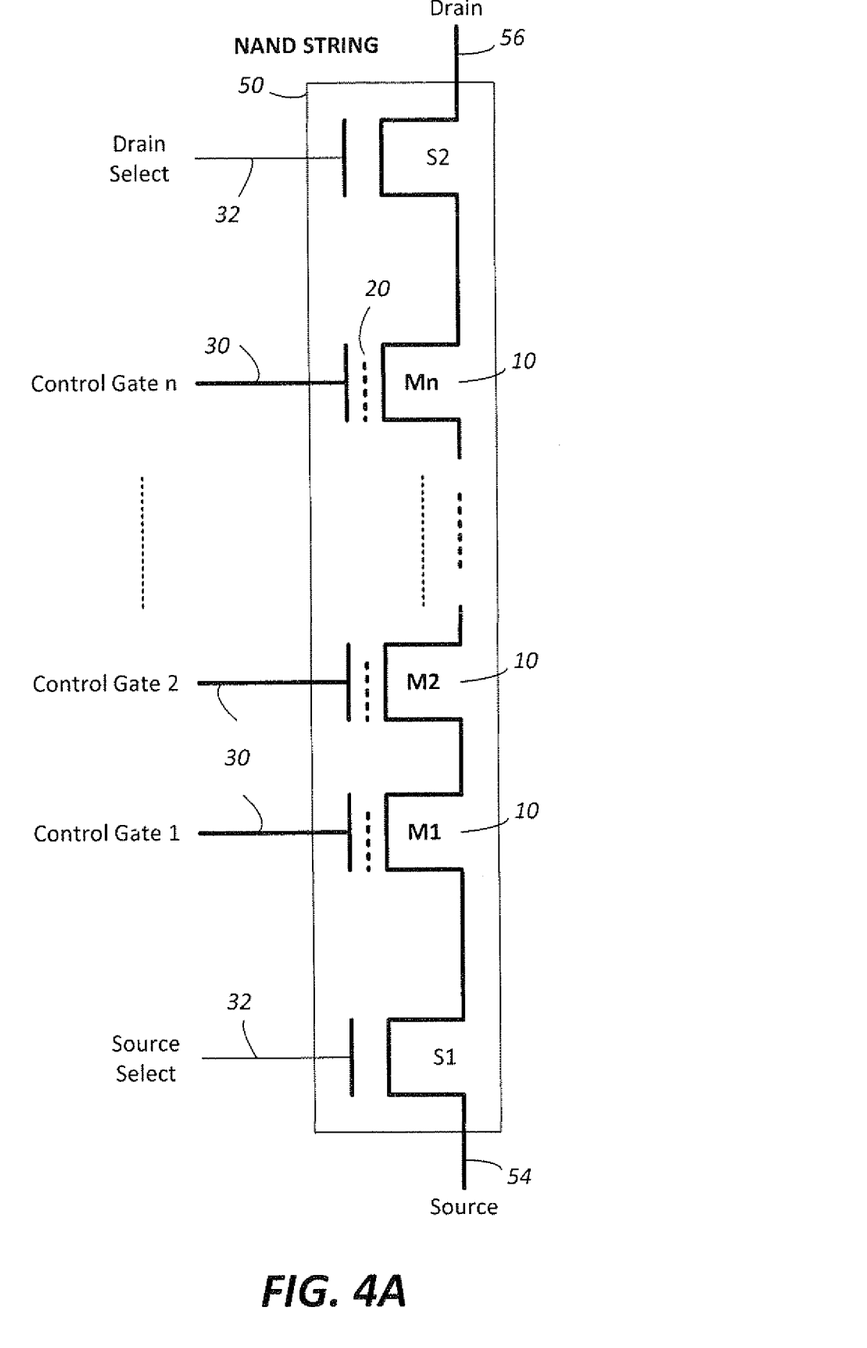
FIG. 4A illustrates schematically a string of memory cells organized into a NAND string.

FIG. 4A illustrates schematically a string of memory cells organized into a NAND string. A NAND string 50 comprises of a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
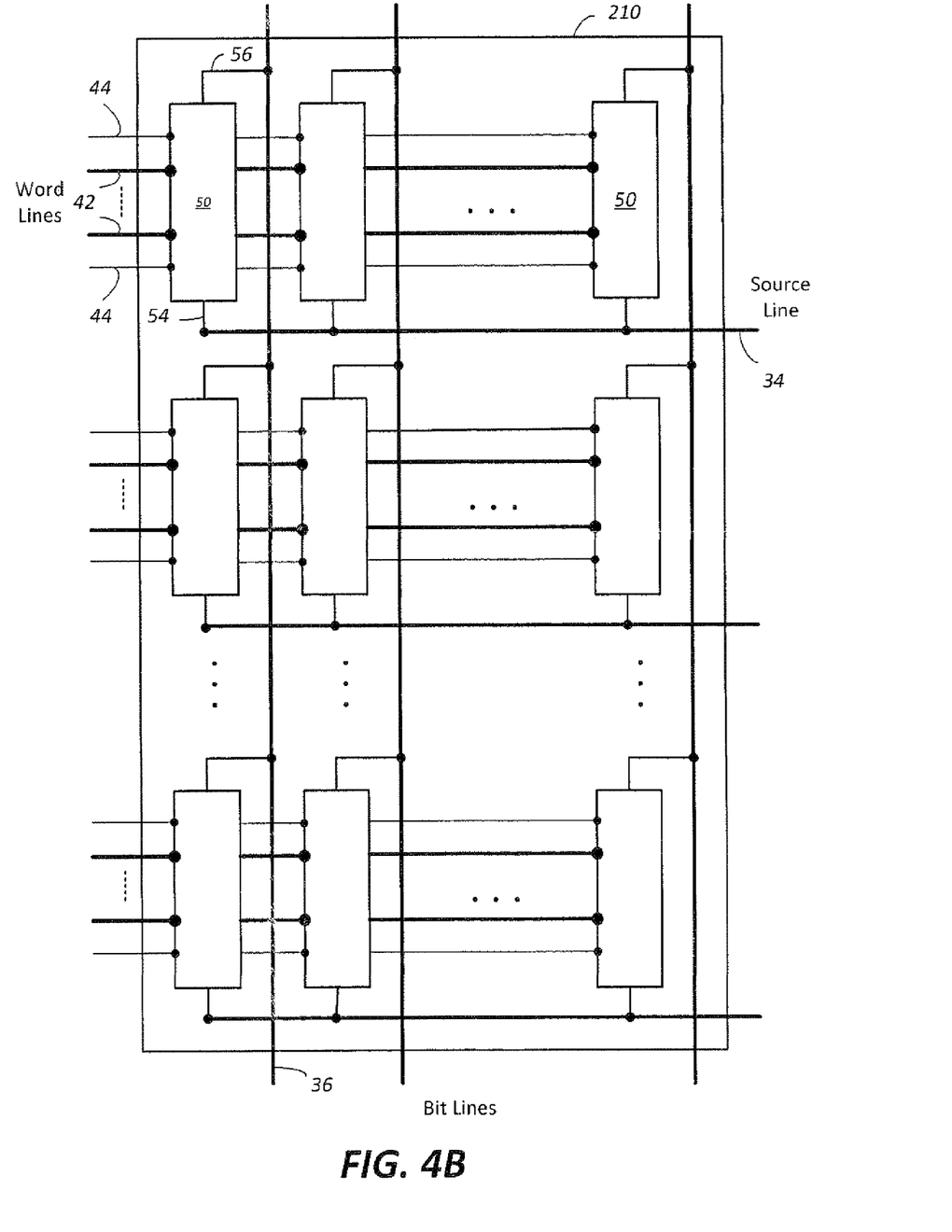
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
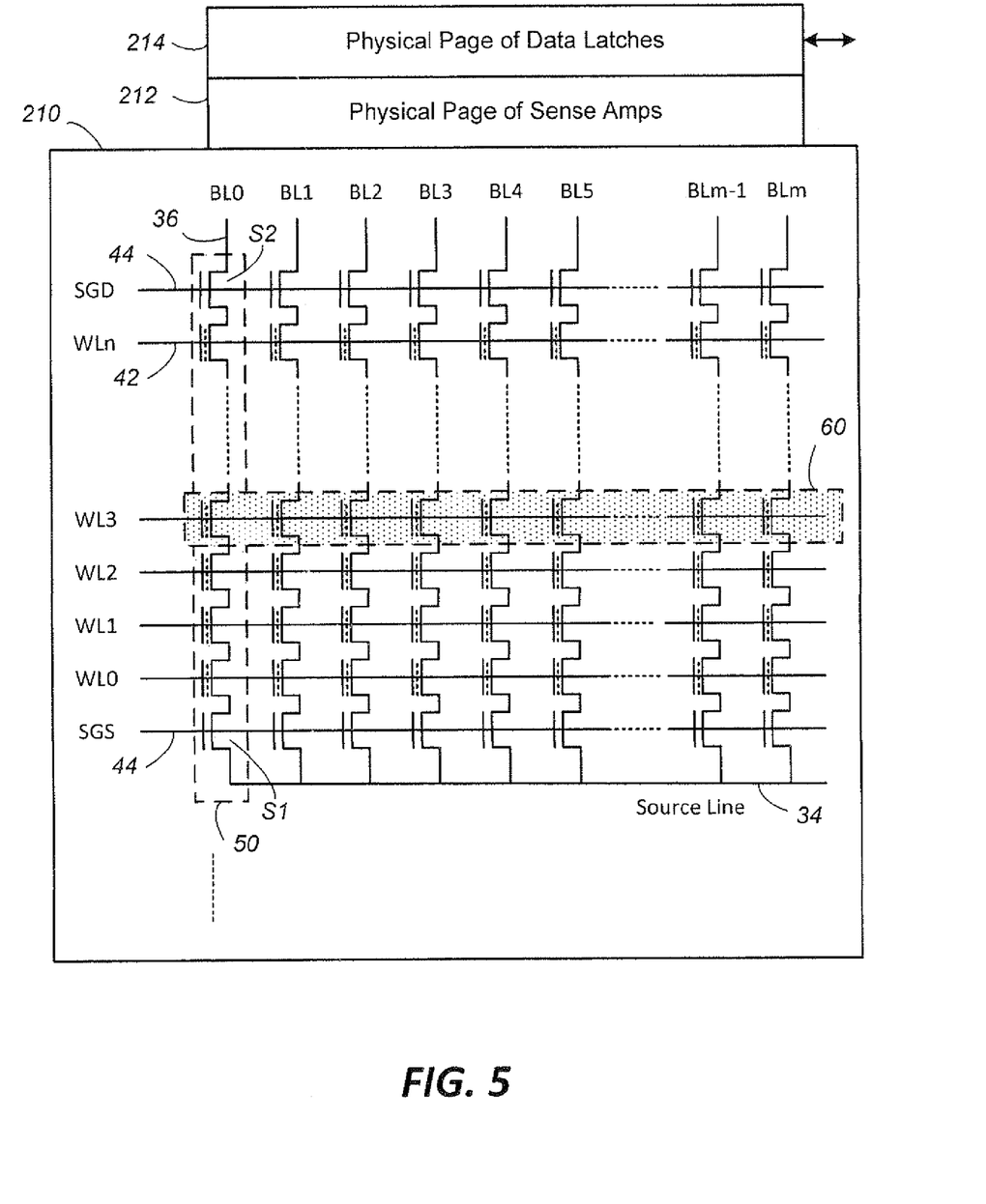
FIG. 5 illustrates a page of memory cells, organized in the NAND configuration, being sensed or programmed in parallel.
Figure 6:
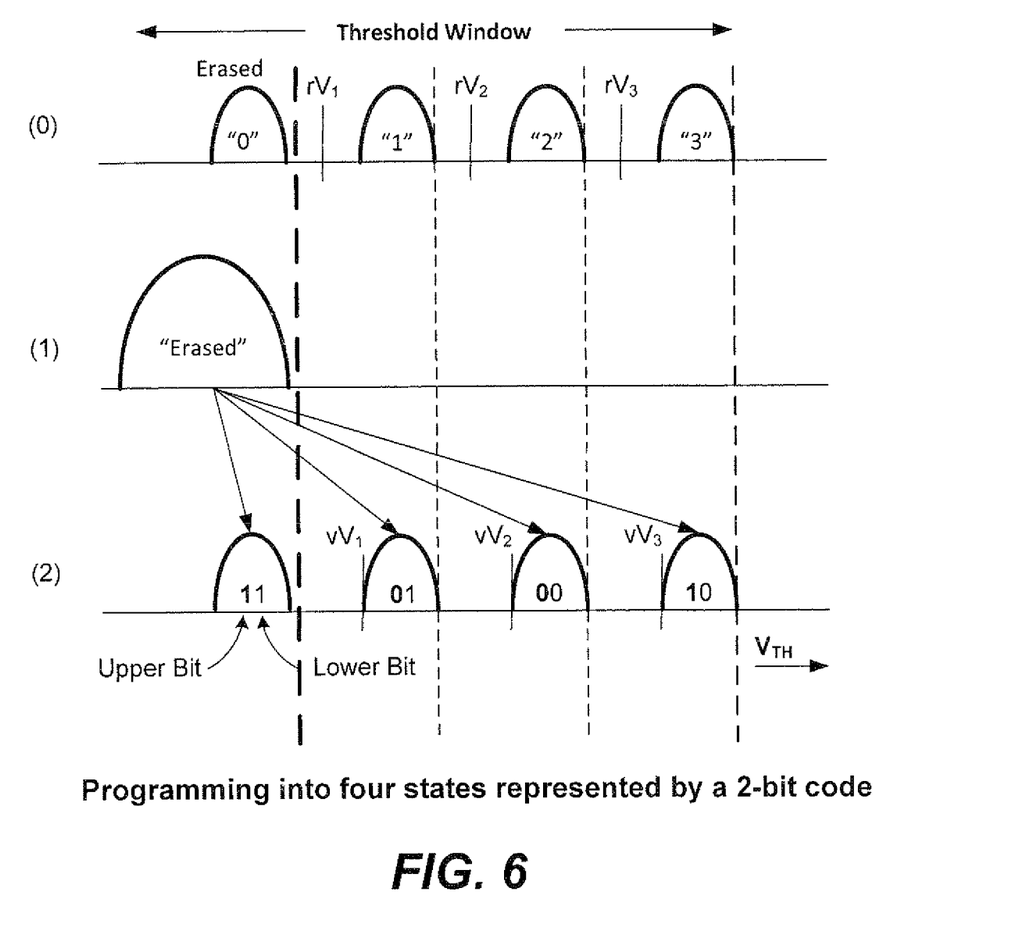

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number, of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

Bit-by-Bit MLC Programming and Reading

Figure 7A:
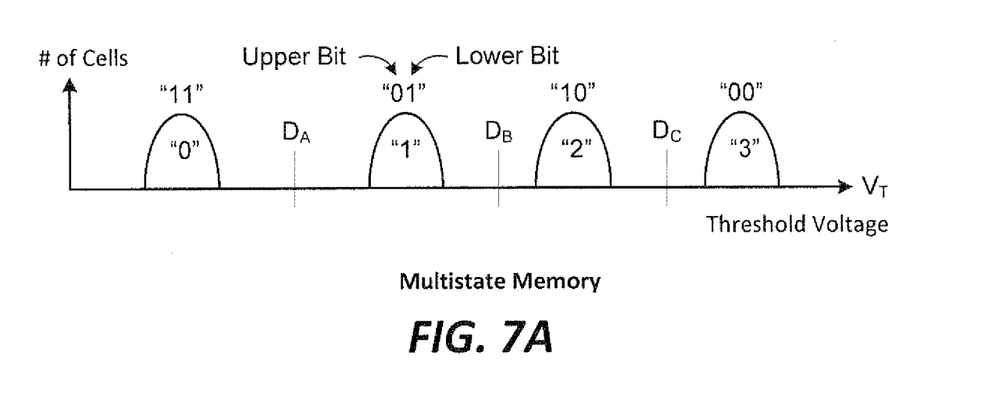
FIGS. 7A-7E illustrates an example of the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
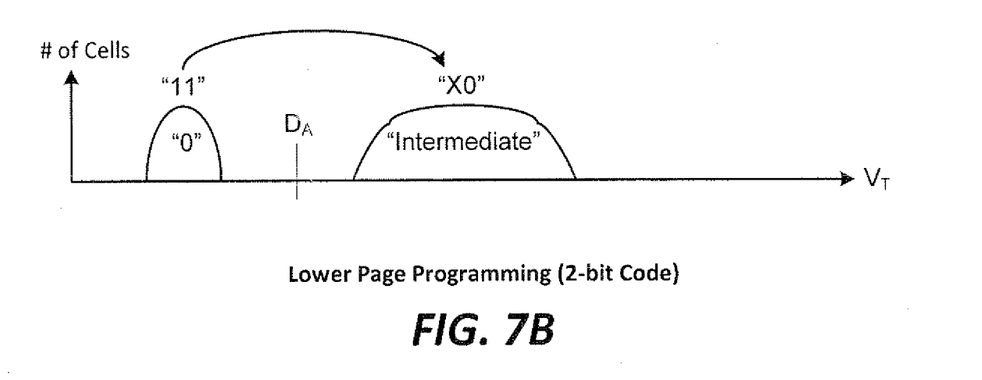

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
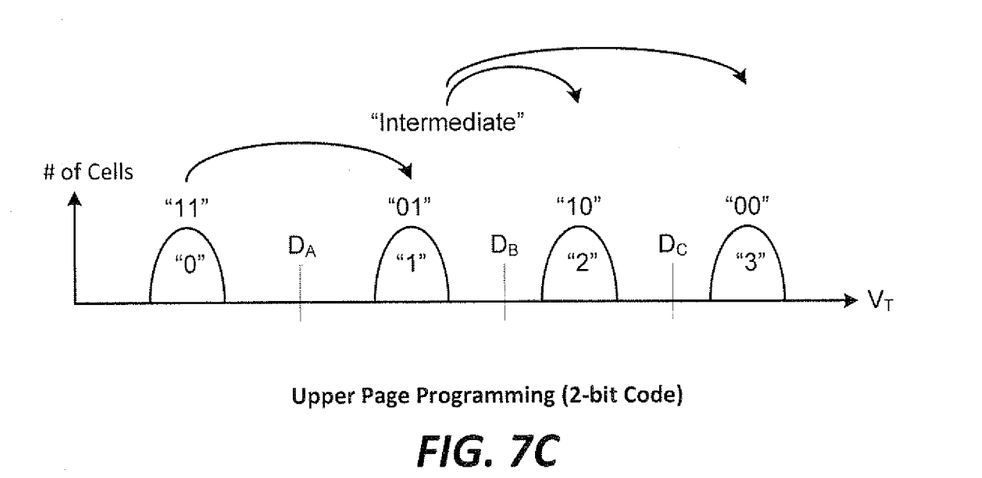

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
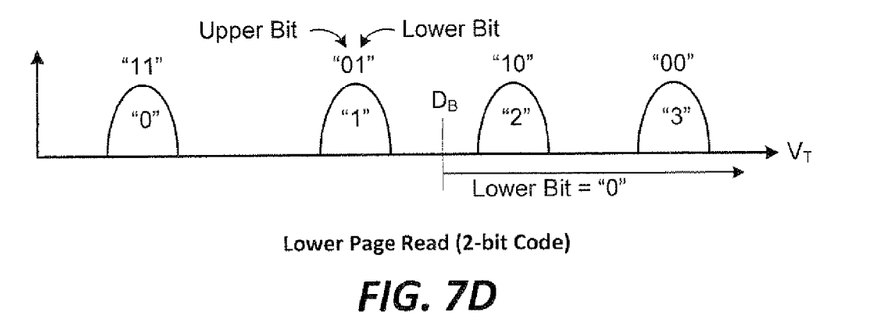

FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
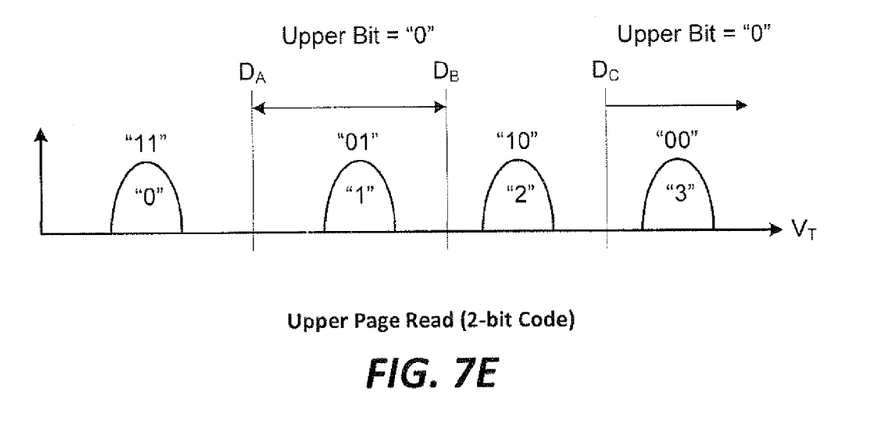

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page.

In many situations, a flash memory will contain physical pages having a mix of programmed levels. Some pages may remain empty with all cells in an erased condition. Some may store one bit per cell (lower page), and are ready to store more data. Some may store two bits per cell (upper page). In many memories this is the most data that is written in a cell. However, in other memories three or more bits may be stored in a cell so that even with two bits per cell there is still capacity for additional data. The capacity remaining in any given physical page depends on the total number of memory states used in the memory system, and the number of states already programmed (i.e. how many bits have already been written per cell). In yet other examples, the number of bits per memory cell may not be an integer (e.g. three states per cell), or some encoding scheme may be used so that a bit of data may be stored over more than one cell. It will be understood that while the present examples refer to determining the number of bits stored per cell, in general it is the number of written states that is determined (and in many cases the number of bits is determined from the number of states). The present embodiments are not limited to any particular mapping of bits to memory states and can be used to determine the number of memory states written regardless of their mapping to particular bits.

In order to know whether additional data can be written in a physical page it is necessary to know if there is data already written in the page, and if so—how much. For example, in a two bit per cell scheme, a physical page of memory cells may have remaining capacity that is sufficient to store two logical pages if it is unwritten, or remaining capacity sufficient to store just one logical page if it already contains one logical page. Any error in determining the amount of data already stored in a physical page can have significant consequences. For example, if a physical page is identified as full when it is not full, this may result in never filling the page so that space is wasted. More importantly, if a physical page is identified as having some additional capacity that it does not have, this may result in writing new data into memory states that are already programmed with previously written data. This can result in the loss of both the previous data and the new data because the resulting memory states may not reflect either of these sets of data. Thus, it is important that the correct programming level of a page be properly identified (e.g. lower page, or lower and upper page).

Figure 8:
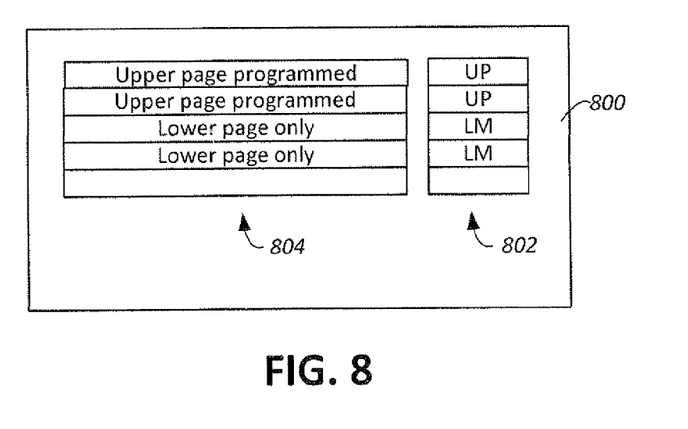
FIG. 8 illustrates a system for indicating the number of states per cell.

One way to indicate the programming level of a page is to maintain a flag (single bit, or multi-bit) or other indicator that reflects the current contents of the page. FIG. 8 shows an example of a memory 800 in which indicators 802 are maintained for each of a group of physical pages 804. Indicators 802 indicate whether the corresponding page is programmed with lower mode (LM) data or both lower and upper page (UP) data. Such an indicator allows the memory system to quickly check whether additional data can be stored in a particular physical page. However, there are drawbacks to this approach. Additional space is required for storage of the indicators and the associated peripheral circuits which increases cost. An indicator of this nature may become corrupted so that some redundancy is needed. In some cases one or even two bytes may be needed to provide the redundancy necessary to ensure an accurate result, with the result obtained by a majority-vote system (assuming less than 50% bits flipped from written state). However, even this may not be enough to ensure accuracy as critical dimensions shrink still further. In some cases, redundancy may cause the same bit (a "1" or "0") to be written in adjacent cells, a pattern which makes disturbance from cell-to-cell coupling more likely as further explained below.

Cell Interactions—Randomization

The charge programmed into the charge storage element of one memory cell produces an electric field that may affect a neighboring memory cell. This may affect the characteristics of the neighboring memory cell. In particular, when sensed, the memory cell will appear to have a different threshold level than it would have if its neighbor was not programmed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

Certain physical patterns of data are known to exacerbate disturbance from cell-to-cell coupling. In particular, where clusters of cells are programmed to the same level this tends to affect neighboring cells. For example, a cell surrounded by cells programmed to the highest state ("00" or "3" state in FIG. 7A) would tend to have its threshold voltage affected by the high levels of charge in the surrounding cells so that it would be likely to be misread.

Such cell-to-cell coupling makes redundant storage of the same bit problematic. While the idea of redundant storage is to provide reliability by correcting a certain number of errors, the pattern of identical bits itself may promote errors.

Cell-to-cell coupling may also be a problem when storing data received from a host or memory controller. Patterns in the data may occur because of the nature of the data, or randomly, and these data patterns may promote cell-to-cell coupling.

Figure 9:
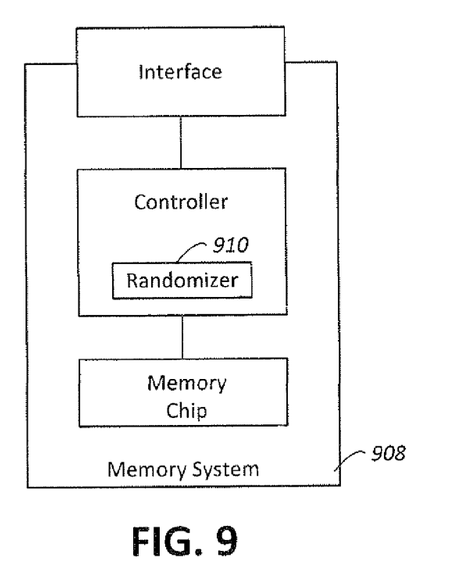
FIG. 9 illustrates a memory system having a randomizer.

FIG. 9 shows a memory system 908 that contains a randomizer 910 to mitigate problems associated with data pattern induced cell-to-cell coupling. In particular, FIG. 9 shows a memory controller that contains randomizer 910 to avoid data patterns that might cause problems, such as clusters of cells programmed to similar levels. While randomizer 910 is shown in the memory controller, a randomizer may also be located in the host interface, or may be located on a memory chip (on-chip), or may be a separate dedicated chip that is connected to the memory array. A randomizer may also be incorporated into the host so that the memory system may not need a randomizer, or may disable randomization when the host indicates that randomization is performed by the host. In some cases, the randomizer may be combined with other circuits (for example ECC circuits). In some examples, a randomizer may be implemented in software operating in a multipurpose hardware component such as a processor.

Figure 10:
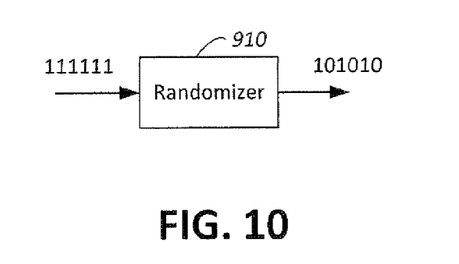
FIG. 10 illustrates the operation of a randomizer.

FIG. 10 shows how randomizer 910 modifies a particular input, which may be for example host data. The randomizer transforms the data by selectively flipping bits according to neighboring bits following an algorithm designed to even out memory states. For example, if a succession of "1"s is sent by the host as shown, the randomizer may flip alternate "1"s so that the data sent for storage in the memory array is a series of alternating "1"s and "0"s. Of course this data must be de-randomized (or unscrambled) before it is returned to the host. Generally, this is done by the same circuit that performed the randomization so that the randomizer may also be a de-randomizer. Examples of randomizers used in flash memory are described in more detail in U.S. Pat. Nos. 6,941,412 and 8,127,200.

Figure 11:
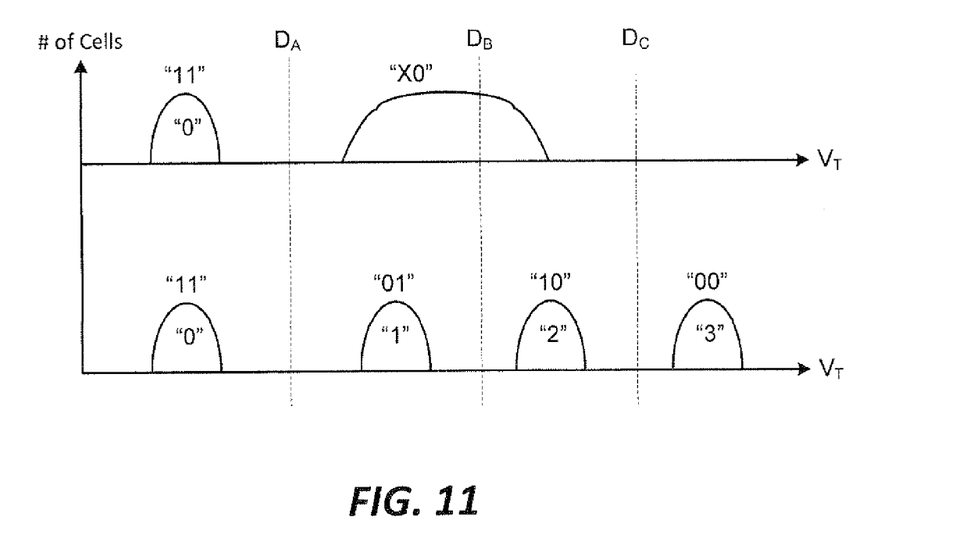
FIG. 11 shows certain read levels used to determine the number of states per cell.

One result of using a randomizer for data stored in flash memory is that certain assumptions may be made about the data stored in the memory. For example, randomized data will result in a more even distribution of memory cells into different memory states than unrandomized data. FIG. 11 shows two different distributions of cell states of a page programmed with only one bit per cell (above) or two bits per cell below. Because the data is randomized, the one-bit per cell distribution may be assumed to result in approximately half of the cells being in the "11" state and half in the "X0" state. The two-bit per cell distribution may be assumed to result in approximately a quarter of the cells being in each of the states "11", "01", "10", "00".

It can be seen from FIG. 11 that, if cells are evenly distributed between states as a result of randomization, then the number of bits stored per cell may be determined directly from the cell contents without the use of some separate flag or indicator if a sufficient population of cells is examined. For example, if the numbers of cells above and below demarcation voltage (cell-read voltage) $D_B$ are approximately the same then this indicates that the upper page (states "2" and "3") were programmed and the cells contain two bits per cell. If most cells (more than 75% in this example) have threshold voltages below $D_B$ then only the lower page is programmed. If the numbers of cells above and below demarcation voltage $D_A$ are approximately the same then this indicates that only the lower page is programmed and the cell contains only one bit per cell. If most cells (approximately 75%) have threshold voltages above $D_A$ then the cell are programmed with upper page data and contain two bits per cell. Erased cells containing no bits per cell will have all cells below both $D_A$ and $D_B$. While this example refers to cells that contain zero, one, or two bits per cell, it will be understood that the principles explained here can be applied to other examples where a memory cell contains three or more bits. The examples use discrimination voltages $D_A$ and $D_B$ for illustration. However, other discrimination voltages could be used and the discrimination voltage used does not have to correspond to a particular voltage used for conventional reading.

One way to determine the number of bits stored per cell for a page or other unit of data would be to read the cells using a discrimination voltage such as $D_A$ or $D_B$ in a conventional manner, and then count the number of cells above or below the discrimination voltage from the data that is read out. The numbers obtained could be compared with predetermined values to determine the number of bits per cell. However, such an additional read step, followed by one or more comparison step, may take significant time (multiple clock cycles) and may have a significant impact on performance.

Source Line Current

According to an aspect of the present invention, the programming level (number of bits per cell) may be obtained from the cells themselves instead of using a dedicated indicator, thus obviating the need for such an indicator, and saving space and complexity involved in the operation of such an indicator. In an example, a current is generated that is representative of the currents through multiple cells of a page and this current is used to obtain an indication of how many bits are stored per cell in the page. This can be done faster than performing a full read operation and subsequent comparison.

Figure 12:
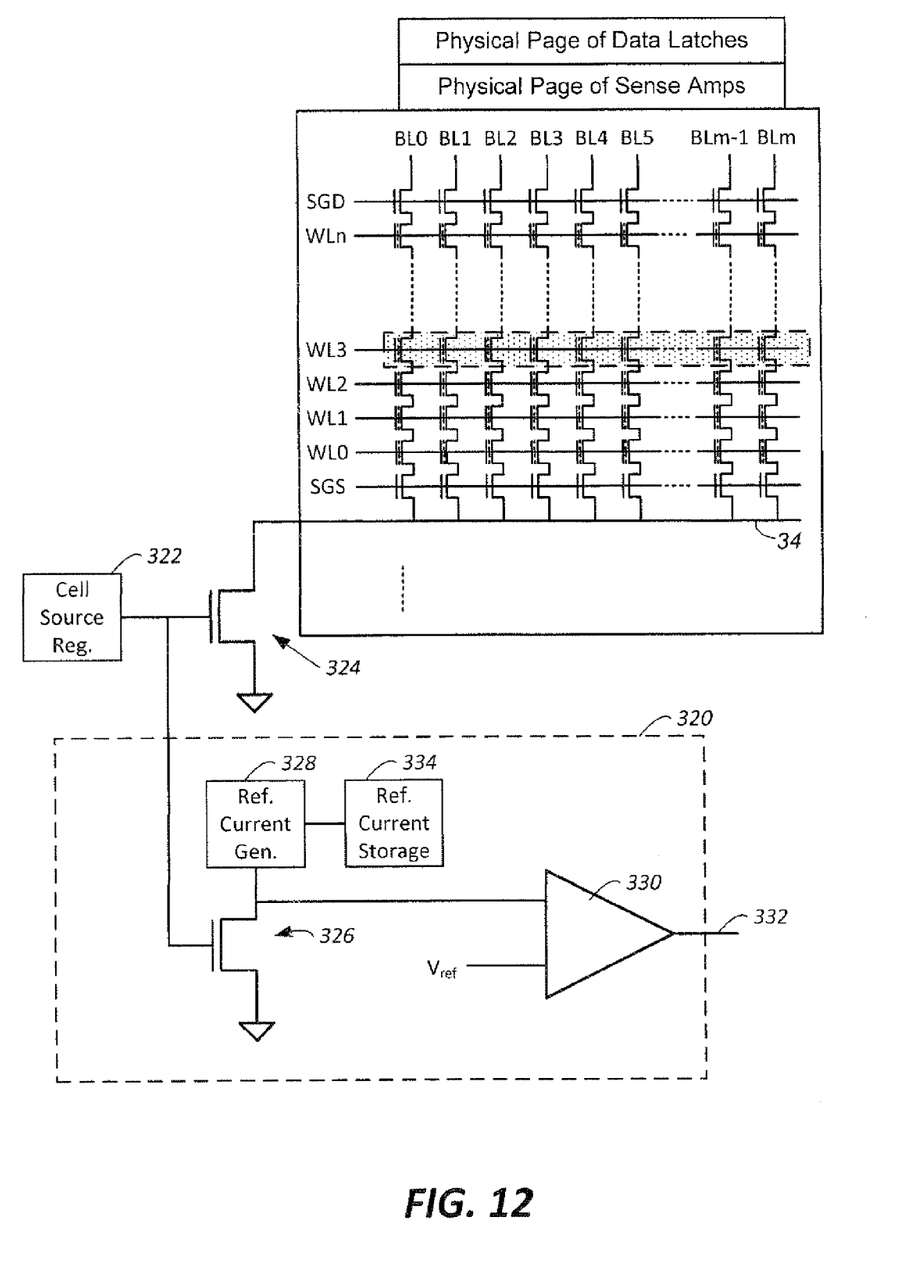
FIG. 12 shows a circuit that determines the number of states per cell stored in a page of flash memory from a current in a source line.

FIG. 12 shows a circuit diagram for an example of a circuit that may be used to determine the number of bits per cell. The memory array is the same as previously described in FIG. 5, with sense amps and data latches for conventional reading of data. However, in addition, a current mirror and comparison circuit 320 is provided that connects to source line 34. As previously described, a source line extends in the same direction as the word lines (horizontally in the present figures) and connects to the source side of multiple NAND strings to sink current flowing through the connected. NAND strings. A single source line may connect to all the NAND strings containing a particular page. The source line provides an electrical connection for the source side of the NAND string, with bit lines providing electrical connection to the drain side of the NAND strings. The bit lines, in turn, connect to sense amps that are used to read the currents passing through cells from the drain side of the NAND string. During reading, a cell source regulator maintains the source side of all the connected NAND strings at a constant voltage. In the present example, this is achieved using a cell source regulator 322 that controls the gate of a transistor 324 that is connected to source line 34.

The current passing through source line 34 is equal to the total current passing through all of the NAND strings connected to it (physically connected and with select gates turned on), which, in turn, is equal to the sum of all the currents that are read by the sense amps connected to those NAND strings. Just as the individual currents through NAND strings may be read at the drain side to determine individual charge levels of memory cells, the total current may be "read" at the source side to provide an indication of the aggregate charge level over all of the memory cells of the page. This aggregate charge level can be tied to a particular level of programming, and to a particular number of bits per cell. For example, as shown in FIG. 11, as a page of cells is programmed from zero bits per cell (all cells in "11" state), to one bit per cell (half in "11" state, half in "X0" state), to two bits per cell (25% in each of "11", "01", "10", "00"), more charge is added to the floating gates of the page of cells. This results in different currents through the NAND strings containing the page so that the source line current (aggregate current for all connected NAND strings) may also be different. Thus, there is a correlation between source line current under read conditions for a particular physical page and the number of bits per cell written in the physical page under predetermined word line voltage bias in a read operation. This correlation may be used advantageously to provide an indicator of the number of states per cell written in the page.

FIG. 12 shows one possible circuit for determining the number of bits per cell from the source line current. FIG. 12 shows that the cell source regulator 322 controls not only the gate of the source line bias transistor 324 but also controls the gate of another transistor 326 which has its source connected to the same common voltage as the source line bias transistor (this may be ground or some other common voltage). The second transistor 326 is designed to have characteristics that are largely the same as the source line bias transistor so that its output mirrors the output of the source line bias transistor. For example, both transistors may be NMOS transistors. This arrangement is commonly known as a current mirror, where the currents in the two transistors reflect each other. However, the second transistor 326 may be scaled down from the source line bias transistor 324 so that the current through the second transistor 326 is some fraction of the current through the source bias transistor 324. The width of the transistor W may be reduced while other characteristics remain the same as the source bias transistor 324. For example, the second transistor 326 may be smaller by a factor N (W=X/N where X the width of the source bias transistor 324) so that the mirror current is correspondingly smaller by a factor N (where N may be, for example, 1000). Even though it is reduced by several orders of magnitude, this current may still be considered a representative current that represents an aggregate of the NAND string currents (i.e. an aggregate of bit line currents through the NAND strings). Because the source line serves many NAND strings, it may have a large current, and it is preferable to use this much smaller mirror current in the comparison circuit 320 to reduce power consumption.

The mirror current produced by the second transistor 326 is compared with a reference current generated by a reference current generator 328 connected to a common node. A voltage comparator 330 provides an output 332 that indicates whether the mirror current is greater than, or less than, the reference current. Such an arrangement may have sensitivity in the microampere ($\mu$A) range. By choosing an appropriate reference current, this output 332 can indicate the number of bits per cell in the page.

In some cases, characteristics of memories are consistent from one unit to another and the same reference currents may be used in all units. Such reference currents may be written in ROM or otherwise stored identically for all units. In many cases, characteristics of memories vary somewhat from one unit to another and reference currents should be obtained for each unit. For example, such reference currents may be obtained during factory die sort, or during some product configuration or initialization process. In some cases, reference currents may be modified during the life of the unit as the unit's characteristics change with use. A memory system may have the ability to internally check what reference currents should be used (e.g. by programming different levels of data and comparing representative currents for the different levels) and to modify reference current values. Such an internal reference current setting operation may be triggered by a certain level of wear, a certain amount of time in use, or by a user input.

When reference currents are obtained they may be stored in some manner that maintains them safely for future use. FIG. 12 shows reference current storage 334 connected to the reference current generator 328. For example, reference currents may be stored in ROM, or using fuses (or antifuses) or in some similar nonvolatile storage.

DAC Conversion from Actual Cell Data to Determine Page Cell States

A universal way to determine how many bits are written per cell is by performing a read operation that is similar to a conventional read operation so that data bits reflecting the cell states are stored in data latches. Two types of sensing schemes are commonly used: positive cell source sensing and sensing with cell sources tied to ground. FIG. 12 shows an example of a circuit configured for positive cell source sensing. An alternative method to that described with respect to FIG. 12 is independent of the type of sensing schemes to be used in READ operations. It works directly with sensed cell data stored in existing data latch. One way to determine the programmed page information is to digitally accumulate the actual cell information per state throughout the page after read operation. However, rather than read out these bits in a conventional manner, which could take significant time, the bits in the data latches may be combined into an analog signal that indicates the overall programming level of the cells (and the number of bits per cell)

Figure 13:
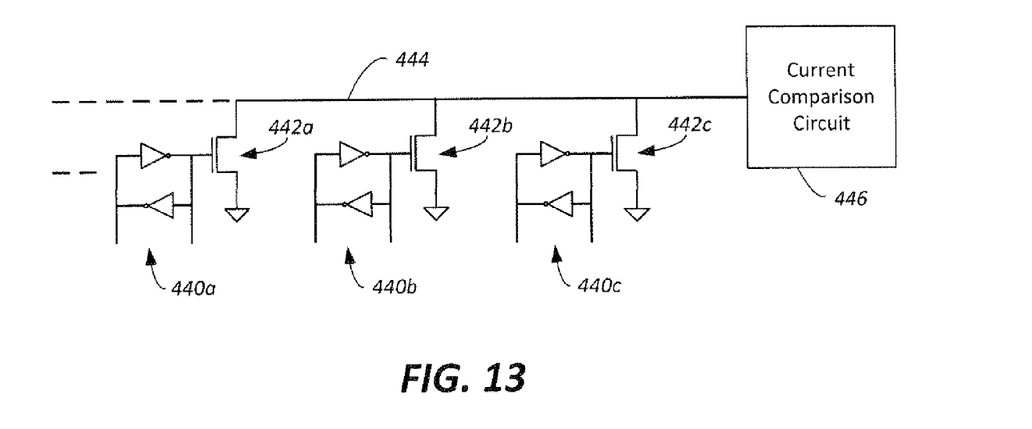
FIG. 13 shows a circuit that determines the number of states per cell stored in a page of flash memory from read data in latches.

FIG. 13 shows a series of data latches 440a-440c that are attached to sense amplifiers (not shown) to store the results of reading a page of cells (only three data latches are illustrated but it will be understood that the present approach is not limited to any particular number of data latches and that a typical page contains multiple sectors of 512 bytes each, with a corresponding number of latches). The reading of cell data may be performed in a conventional manner so that the contents of a particular data latch reflect whether the corresponding memory cell was programmed above or below a certain level. As previously described, these programming levels, aggregated over a sufficient number of cells (e.g. a page), may indicate the number of bits per cell written in the cells.

In FIG. 13, each data latch 440a-440c is connected to the gate of a corresponding transistor 442a-442c so that current flow through the transistor depends on the contents of the corresponding data latch. All of the transistors are connected in parallel between a common line 444, and a common voltage such as ground. Thus, the current flowing through the common line 444 is the sum of the individual currents through the transistors 442a-442c. The current on the common line 444 may thus be considered as an analog output that represents the combined binary contents of the data latches 440a-440c. Such an analog output may be generated rapidly once data is placed in the data latches (less than a single clock cycle).

Figure 14:
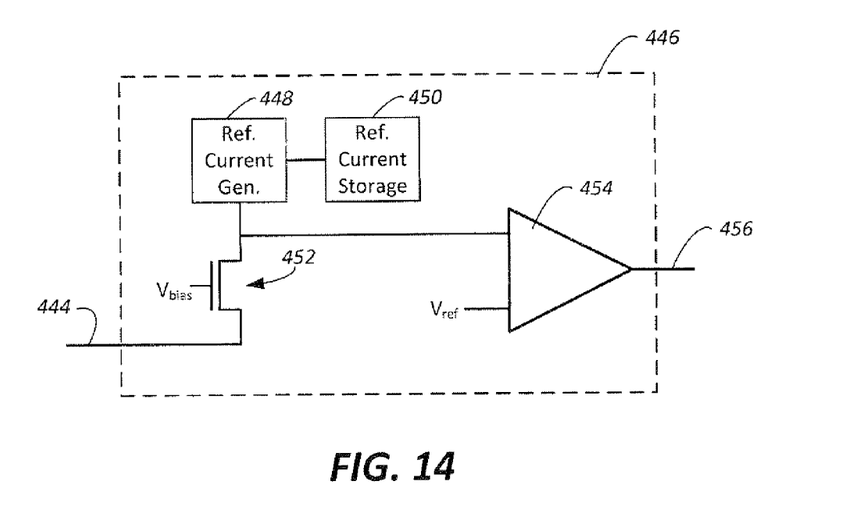
FIG. 14 shows an example of a current comparison circuit used with the circuit of FIG. 13.

A current comparison circuit 446 is connected to the common line 444 to compare the current on the common line with one or more reference currents. FIG. 14 shows an example of a current comparison circuit 446 that may be used to perform such comparison. A reference current generator 448 generates a reference current according to information stored in a reference current storage unit 450. The reference current generator 448 is connected to a node, with the common line 444 connected to the node through a biasing transistor 452 (with $V_{bias}$ applied to its control gate). The voltage at this node is supplied to a voltage comparator 454 where it is compared with a reference voltage, $V_{ref}$. By setting the values of $V_{bias}$, $V_{ref}$, and the reference current, the output 456 of the voltage comparator 446 may indicate the number of bits per cell.

In one example Vbias and Vref are fixed for a particular memory design, with the reference current being obtained separately for each unit. The reference current may be stored in some form of nonvolatile storage. In some cases the reference current may be modified during the operating life of the unit to reflect wear of the memory cells in the memory array.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of determining how many states are written per cell in a page of flash memory comprising:
generating a representative current from bit line currents of a plurality of bit lines connected to flash memory cells of the page; and
comparing the representative current with a predetermined reference current to obtain an indication of how many states are written per page.

2. The method of claim 1 wherein the representative current is generated from a regulator connected to the plurality of bit lines during a read operation, the representative current being proportional to the total current through the plurality of bit lines during a read operation.

3. The method of claim 2 wherein the flash memory is a NAND flash memory and the regulator controls the voltage level of the source line that connects to the source side of a plurality of NAND strings containing the page of flash memory cells.

4. The method of claim 1 wherein the bit line currents are generated under read conditions corresponding to a flash memory cell threshold voltage that is below the threshold voltage of a flash memory cell programmed with more than one bit per cell.

5. The method of claim 1 further comprising generating the representative current through a current mirror which generates a mirror current that is proportional to the bit line currents of the plurality of bit lines connected to flash memory cells of the page.

6. The method of claim 5 wherein the mirror current is approximately 1/1000 of the current in the plurality of bit lines.

7. A multi-level cell flash memory comprising:
a plurality of flash memory cells forming a page;
a common source line connected to the plurality of flash memory cells forming the page so as to sink current flowing through all of the plurality of flash memory cells;
a current mirror configured to provide a mirror current that is proportional to the current in the common source line; and
a current comparison circuit that compares the mirror current with a predetermined reference current.

8. The flash memory of claim 7 wherein the flash memory is a NAND flash memory and the common source line is connected to the source side of a plurality of NAND strings that contain the plurality of flash memory cells forming the page.

9. The flash memory of claim 7 wherein the common source line is connected to a first transistor that is controlled by a regulator to maintain source line voltage, and the regulator controls a second transistor in the current mirror that is smaller than the first transistor to provide a mirror current that is smaller than the current in the common source line.

10. The flash memory of claim 7 further comprising a reference current generator that generates the predetermined reference current.

11. The flash memory of claim 10 further comprising a reference current storage unit that maintains a value reflecting the predetermined reference current in nonvolatile storage and provides the value to the reference current generator.

12. The flash memory of claim 10 further comprising a voltage comparator comparing a predetermined reference voltage with a voltage at a node between the reference current generator and the current mirror.

13. A method of identifying a degree of programming of a page of flash memory comprising:
providing a current to a plurality of memory cells that form the page of flash memory through a common line while the plurality of memory cells are subjected to read conditions;
mirroring the current through the common line to generate a mirror current that is proportional to the current in the common line; and comparing the mirror current with a predetermined reference current to determine if the current through the plurality of cells reflects programming beyond a predetermined degree.

14. The method of claim 13 further comprising obtaining the predetermined reference current from mirror current values observed with known degrees of programming.

15. The method of claim 14 wherein the obtaining the predetermined reference current is performed as part of a product configuration routine.

16. The method of claim 13 further comprising, subsequent to the comparing, writing data in the plurality of cells only if the comparing reflects that the plurality of cells are not programmed beyond the predetermined degree.

17. The method of claim 13 wherein the plurality of memory cells are configured to have four memory states and the predetermined degree corresponds to cells programmed to only two lower memory states.

* * * * *